United States Patent
Bryce et al.

(10) Patent No.: US 9,318,692 B1
(45) Date of Patent: Apr. 19, 2016

(54) SELF-LIMITED CRACK ETCH TO PREVENT DEVICE SHORTING

(71) Applicant: International Business Machines Corporation, Armonk, NY (US)

(72) Inventors: Brian A. Bryce, Chevy Chase, MD (US); Josephine B. Chang, Bedford Hills, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/629,659

(22) Filed: Feb. 24, 2015

(51) Int. Cl.
| | |
|---|---|
| *H01L 41/02* | (2006.01) |
| *H01L 41/29* | (2013.01) |
| *H01L 41/332* | (2013.01) |
| *H01L 21/3213* | (2006.01) |
| *H01L 29/78* | (2006.01) |
| *H01L 27/20* | (2006.01) |
| *H01L 29/84* | (2006.01) |

(52) U.S. Cl.
CPC ........ *H01L 41/332* (2013.01); *H01L 21/32136* (2013.01); *H01L 21/32139* (2013.01); *H01L 27/20* (2013.01); *H01L 29/7845* (2013.01); *H01L 29/84* (2013.01)

(58) Field of Classification Search
None
See application file for complete search history.

(56) References Cited

U.S. PATENT DOCUMENTS

| | | | |
|---|---|---|---|
| 4,454,639 | A | 6/1984 | Dworsky et al. |
| 6,024,885 | A | 2/2000 | Pendharkar et al. |
| 6,492,222 | B1 | 12/2002 | Xing |
| 6,964,928 | B2 | 11/2005 | Ying et al. |
| 7,199,055 | B2 | 4/2007 | Chen et al. |
| 8,166,632 | B1 | 5/2012 | Zhang et al. |
| 2008/0060181 | A1* | 3/2008 | Fazzio ............... H03H 9/02149 29/25.35 |

OTHER PUBLICATIONS

Baek et al., "Giant piezoelectricity on Si for hyperactive MEMS," Science, vol. 334, No. 6058, 2011, pp. 958-961.
Mischenko et al., "Giant electrocaloric effect in the thin film relaxor ferroelectric 0.9 PbMg 1/3 Nb 213 O 3-0.1 PbTiO 3 near room temperature," Applied Physics Letters, vol. 89, No. 24, 2006, 242912 3 pages.
Newns et al., "A Low-Voltage High-Speed Electronic Switch Based on Piezoelectric Transduction," J. Appl. Phys., vol. 111, No. 8, 2012, 084509, 18 pages.
Reitz et al., "Damascene technique applied to surface acoustic wave devices," Journal of Vacuum Science & Technology B, vol. 25, No. 1, 2007, pp. 271-276.

* cited by examiner

*Primary Examiner* — Joseph Schoenholtz
(74) *Attorney, Agent, or Firm* — Cantor Colburn LLP; Vazken Alexanian

(57) ABSTRACT

A semiconductor device includes a piezoelectric layer interposed between a first metal layer and a hardmask layer. A first trench extends through the hardmask layer, the piezoelectric layer and the first metal layer. A self-limiting second trench extends through the hardmask layer and the piezoelectric layer without reaching the first metal layer.

20 Claims, 8 Drawing Sheets

SELF-LIMITED CRACK ETCH TO PREVENT DEVICE SHORTING

STATEMENT REGARDING FEDERALLY SPONSORED RESEARCH OR DEVELOPMENT

This invention was made with Government support under N66001-11-C-4109 awarded by Defense Advanced Research Projects Agency. The Government has certain rights to this invention.

BACKGROUND

The present invention relates generally to semiconductor devices, and more specifically, to a self-limited crack etching process that forms a semiconductor device that is less susceptible to short circuits.

Piezoelectric transistors (PETs) include a piezoelectric element (PE) that may be displaced to modulate the resistance of a piezoresistive (PR) element. The materials used to create a PET pose challenges in formation of the PET. One such challenge is forming a PET structure including a first PET device that requires sputtering through a metal gate layer when forming the first device, while also including a second PET device where sputtering through the metal gate layer and electrical shorting one the sidewall of the piezoelectric material is undesirable.

To prevent electrical shorting caused by metal re-sputtering from forming on the second PET device, current fabrication processes typically use multiple masks and etching processes to isolate the PE material of the second PET device from re-sputtering that may occur when etching the first PET device. However, the additional masks and etching process increase overall costs and resource consumption.

Another attempt to prevent sputtered metal residue from forming on the piezoelectric material of the second device is to form the metal gate material from specific materials with a low tendency to re-sputter and/or are non-conductive after undergoing a sputtering process. This solution, however, may limit the overall application of the piezoelectric material according to the type of material used form the gate metal layer.

SUMMARY

According to at least one embodiment of the present invention a method of fabricating a semiconductor device, the method comprising forming a starting substrate including a piezoelectric layer interposed between a first metal layer and a hardmask layer. The method further includes performing a patterning process that forms a first pattern in the hardmask having a first size and a second pattern in the hardmask having a second size less than the first size. The method further includes performing an etching process that transfers the first pattern through the first metal layer while the second pattern self-limits at the piezoelectric layer without reaching the first metal layer.

According to another embodiment, a semiconductor device comprises a piezoelectric layer interposed between a first metal layer and a hardmask layer. A first trench extends through the hardmask layer, the piezoelectric layer and the first metal layer. A self-limiting second trench extends through the hardmask layer and the piezoelectric layer without reaching the first metal layer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. FIGS. 1A-5 are a series of views illustrating a process flow of forming a semiconductor device according to non-limiting embodiments of the invention, in which:

FIG. 1A is a top view illustrating a hardmask layer formed on a starting substrate;

FIG. 3A top view illustrating the hardmask layer of FIG. 1A following an single pattern transferring process that exposes the base layer via the guard trench and the piezoelectric layer via the isolated crack;

FIG. 4 is a cross-sectional view of the substrate illustrated in FIGS. 3A-3B following removal of the remaining hardmask layer and showing a piezoelectric device including self-limiting isolated cracks that prevent exposing the piezoelectric material from exposure to re-sputtered metal.

FIG. 5 is a flow diagram illustrating a method of fabricating a semiconductor device according to a non-limiting embodiment of the invention.

DETAILED DESCRIPTION

Conventional methods to prevent re-sputtered metal from adhering to side-walls of a PET device when etching neighboring metal layers typically include fabrication processes that implement multiple masks to isolate the PET device, or implement specific expensive metal layers that inhibit sputtering. Unlike conventional methods, at least one embodiment of the invention utilizes a guard trench and one or more self-limiting isolated cracks. The guard trench isolates a PET device from neighboring PET devices formed on a common substrate. The isolated cracks can be sized such that they self-limit before reaching the underlying metal layer. Therefore, the PET device can be formed using the same etching process used to expose the underlying metal layer, without exposing the PE material of the isolated PET device to re-sputtered metal material. Accordingly, a PET device can be protected from re-sputtered metal while simultaneously patterning an underlying metal layer of a common substrate without requiring additional masks and/or expensive non-sputtering metal materials.

Figure 1A:
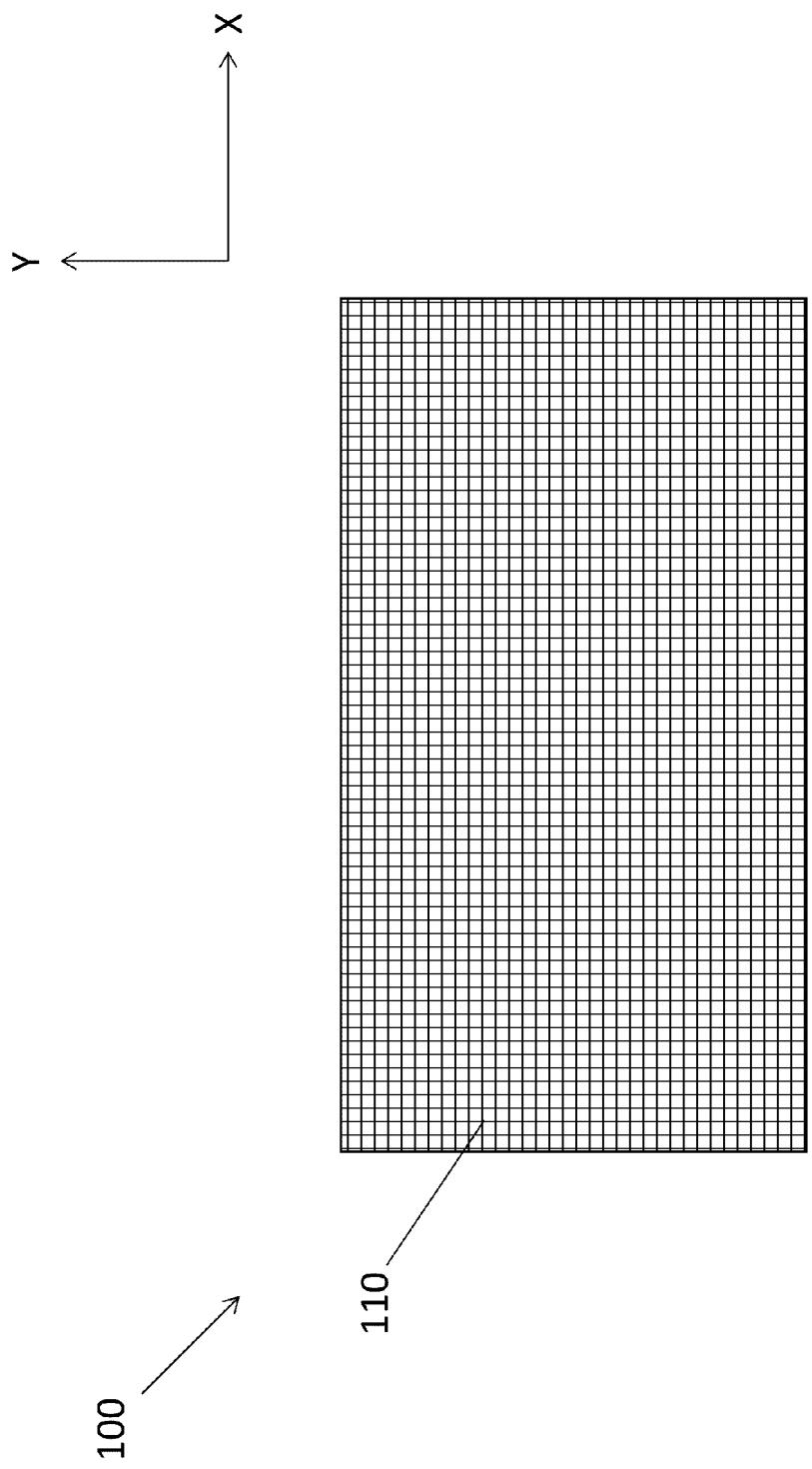
Figure 1B:
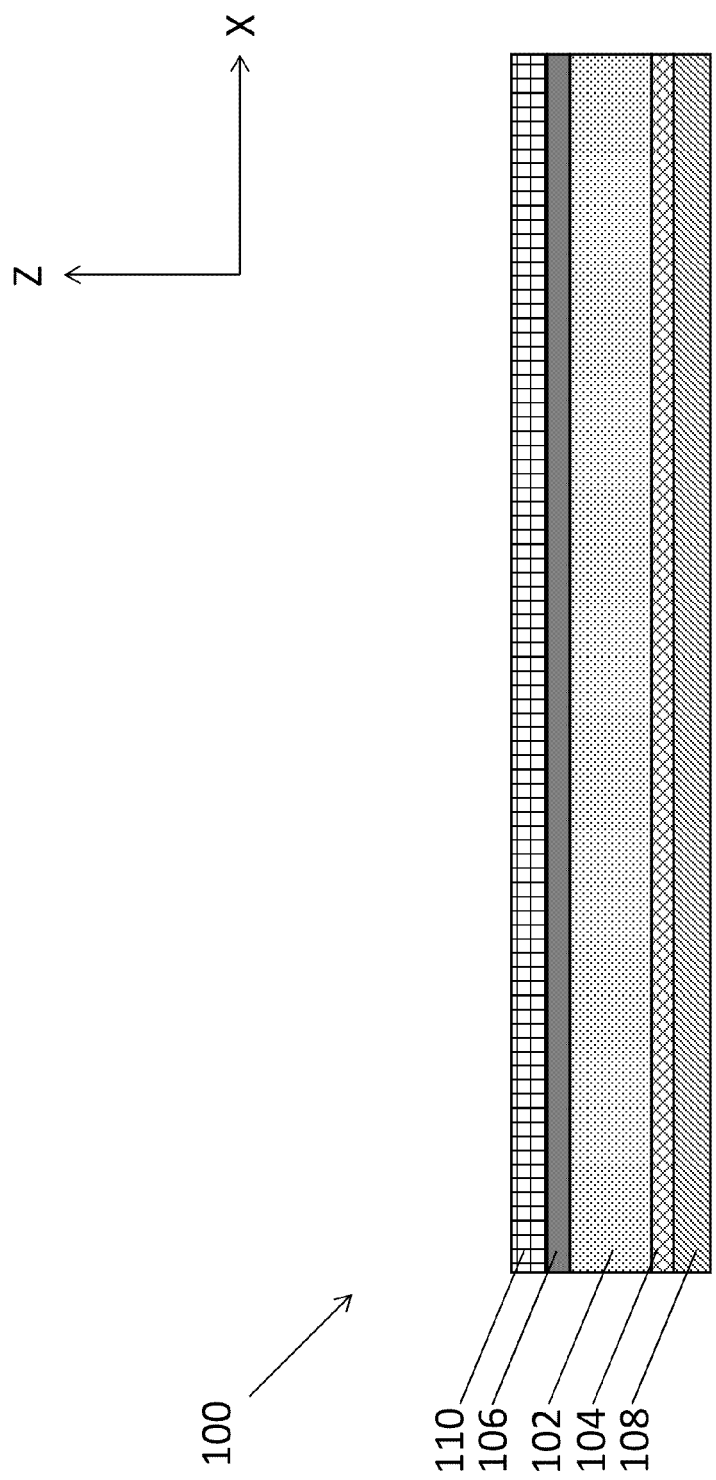
FIG. 1B is a cross-sectional view of the starting substrate illustrated in FIG. 1A taken along line A-A illustrating a metal gate layer formed on an upper surface of a base layer, a piezoelectric layer formed on an upper surface of the metal gate layer, a second metal layer formed on an upper surface of the piezoelectric layer; and the hardmask layer formed on an upper surface of the second metal layer.

With reference now to FIGS. 1A-1B, a starting substrate 100 is illustrated according to a non-limiting embodiment of the invention. The starting substrate 100 includes a plurality of layers extending along a first axis (e.g., X-axis) to define a length, a second axis (e.g., Y-axis) to define a width, and third axis (e.g., Z-axis) to define a thickness. The layers of the starting substrate 100 include a piezoelectric layer 102 interposed between an opposing pair of metal layers 104 and 106. The piezoelectric layer 102 may comprise various piezoelectric materials including, but not limited to, lead magnesium niobate (PMN), lead magnesium niobate-lead titanate (PMN-PT) and lead zirconium titanate (PZT).

The first metal layer 104, hereinafter referred to as a metal gate layer 104, forms a gate terminal. The first metal layer 104 may comprise various materials that promote growth of a piezoelectric element material including, for example, platinum (Pt). The second metal layer 106 can form a common terminal of the device, and comprises various materials that inhibit the transfer of oxygen ions including, but not limited to, ruthenium (Ru), ruthenium oxide (RuO2), iridium. (Ir), and iridium oxide (IrO$_2$). The second metal layer 106 can also comprise a combination of PT and a transition metal film to which a low concentration of holes such as, for example, (SMSe) to inhibit the transfer of oxygen ions. The first metal layer 104 may be formed on a base layer 108. The base layer may comprise various materials including, but not limited to, silicon dioxide/titanium dioxide (SiO$_2$/TiO$_2$), silicon nitride (SiN)+hafnium oxide (HfO$_2$), or SiO$_2$+HfO$_2$. A hardmask layer 110 is formed on an upper surface of the second metal layer 106. The hardmask layer 110 comprises, for example, nickel (Ni).

Figure 2A:
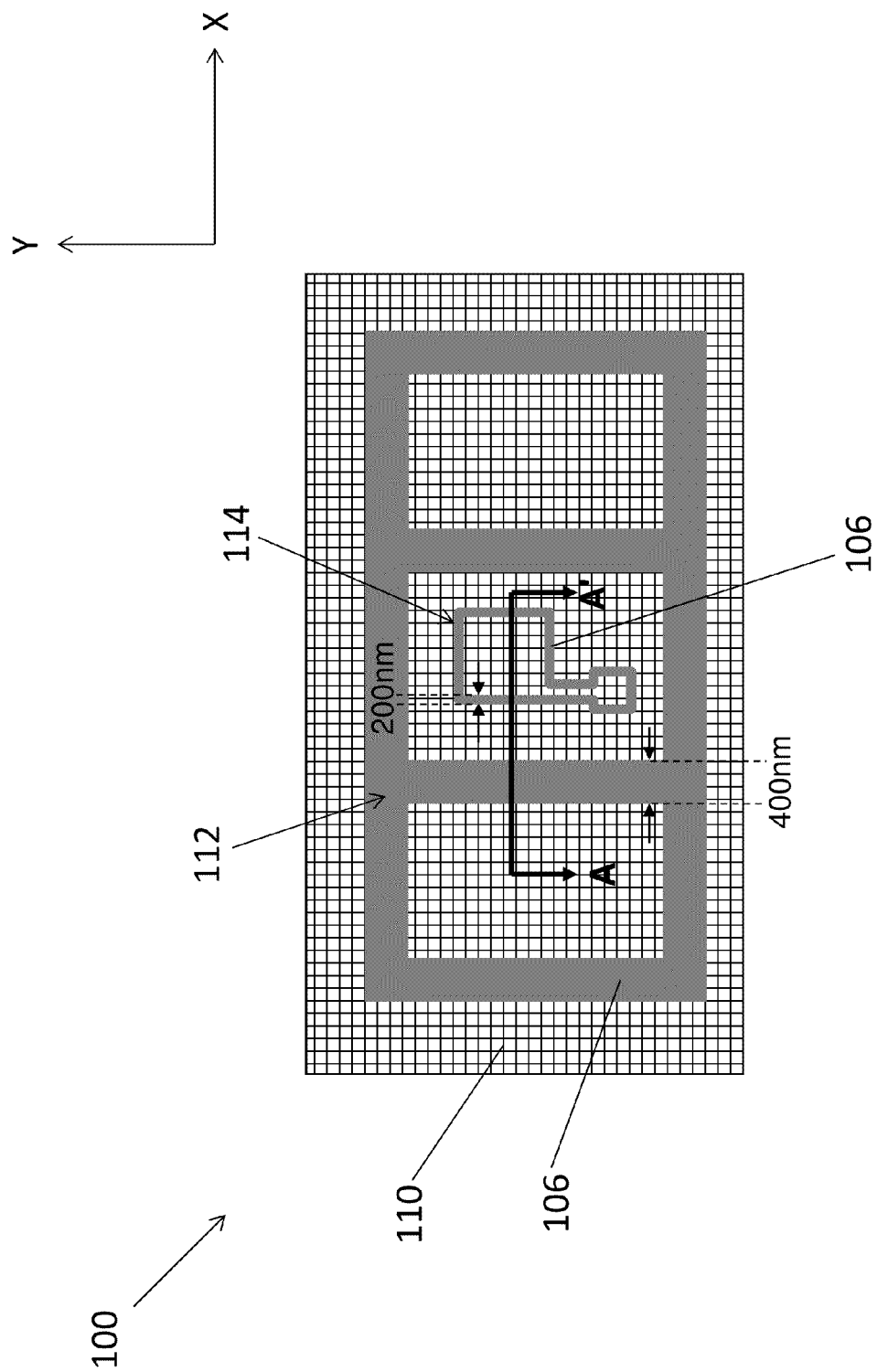
FIG. 2A is a top view illustrating the hardmask layer of FIG. 1A following an etching process that patterns a guard trench and an isolated crack in the hardmask layer.
Figure 2B:
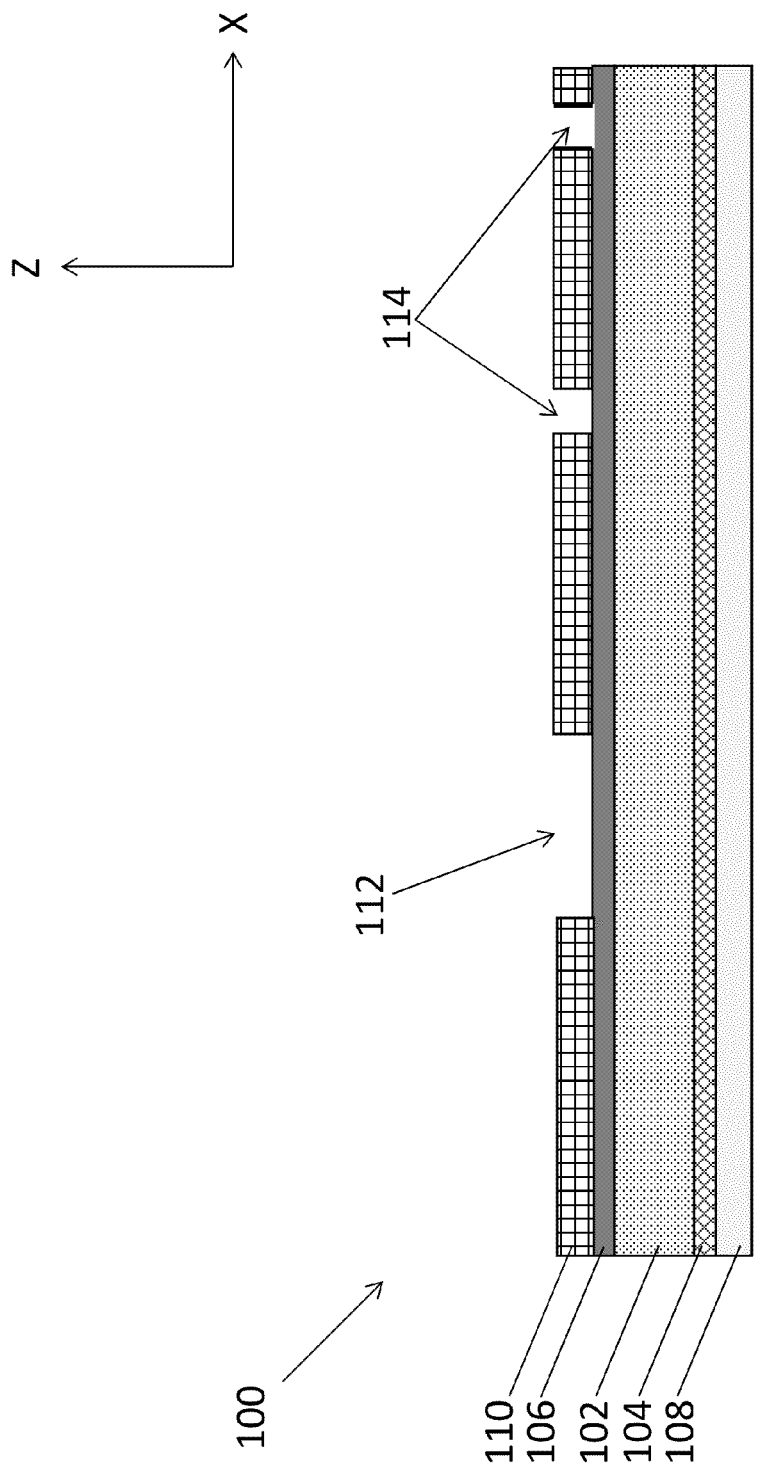
FIG. 2B is a cross-sectional view of the substrate illustrated in FIG. 2A taken along line A-A illustrating showing the guard trench having a size greater than the isolated crack.

Turning now to FIGS. 2A-2B, the substrate 100 is shown following an etching process that patterns a first pattern, i.e., a guard trench 112, and a second pattern, i.e., an isolated crack 114, in the hardmask layer 110. The guard trench 112 has a size that is greater than the size of the isolated crack 114, and guards the first layer 104 from neighboring devices as discussed in greater detail below. For example, the guard trench 112 may have a length of 400 nm while the isolated crack has a length of 200 nm. The dimensions of the guard trench 112 and the isolated crack 114 are not limited thereto. The guard trench 112 and the isolated crack 114 are also not limited to any particular shape or design. According to an embodiment, the guard trench 112 surrounds the isolated crack 114. In this manner, the isolated crack can be protected during a pattern transferring process that transfers the patterns the guard trench 112 and the isolated crack 114 into the remaining layers of the substrate 100. For example, the guard trench 112 electrically isolates a particular patterned PET from other PETs located in close proximity, i.e., to the left or right, of the patterned PET. The wider etch area in the etch mask allows the etching depth to reach the first metal layer 104 where it will re-sputter the metal onto the sidewall of the PE, while still etching through the material. Accordingly, the guard trench 112 electrically isolates the patterned PET from an adjacent PET device electrically.

The guard trench 112 and the isolated crack 114 are simultaneously patterned in the hardmask layer 110 using a single selective etching process such as, for example, a reactive ion etch (RIE) process. It should be appreciated, however, that the small areas, e.g., the isolated crack 114 will etch slower in the vertical direction than the large areas, e.g., the guard trench 112. Accordingly, the initial opening of the isolated crack 114 can be sized such that the isolated crack 115 self-limits before reaching the first metal layer 104, while the guard trench 112 will etch completely through the first metal layer 104 to achieve a desired pattern as further illustrated in FIGS. 3A-3B. The underlying metal layer 106 may be utilized as an etch stop layer. In this manner, the hardmask layer 110 is patterned to form the guard trench 112 and the isolated crack 114 while stopping on an upper surface of the metal layer 106.

Figure 3A:
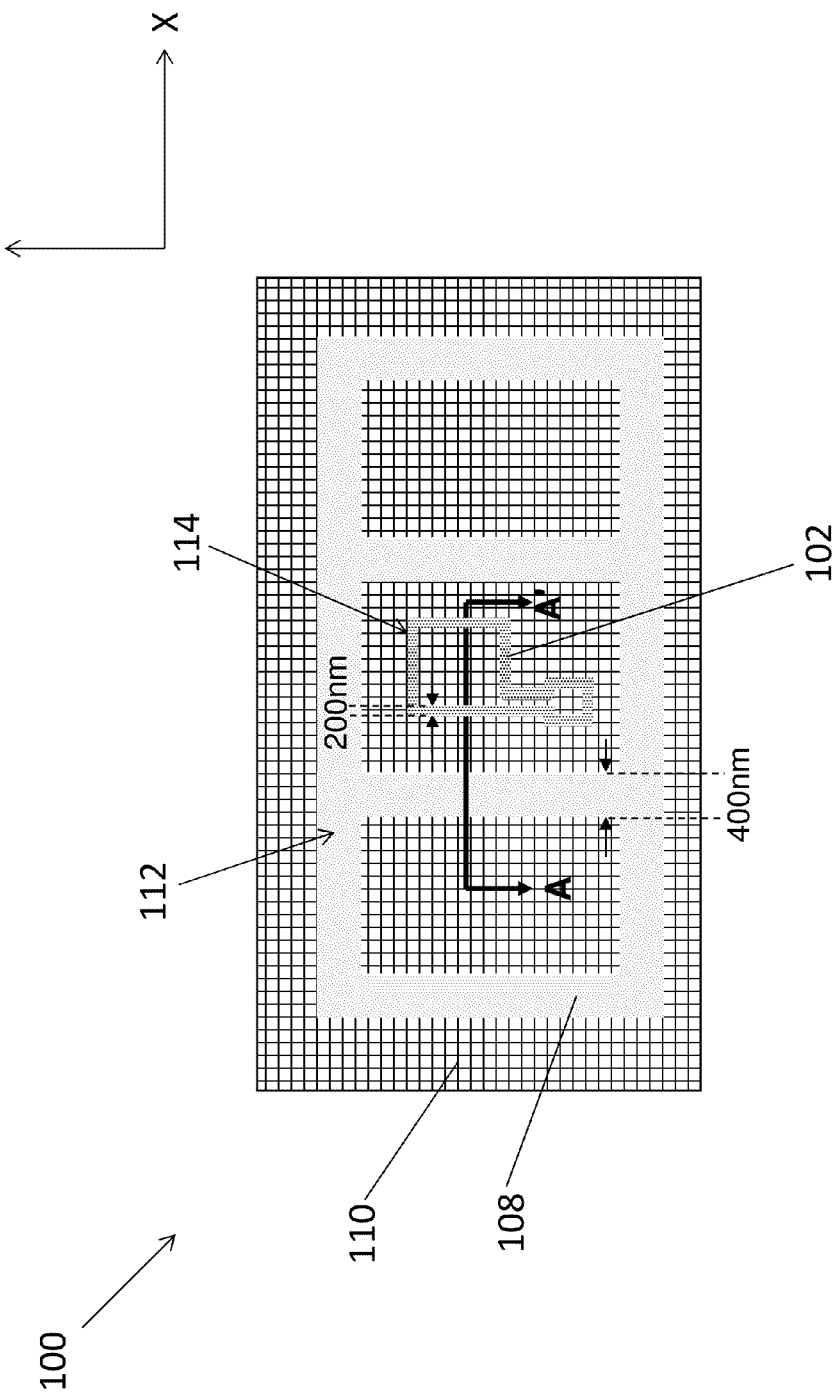
Figure 3B:
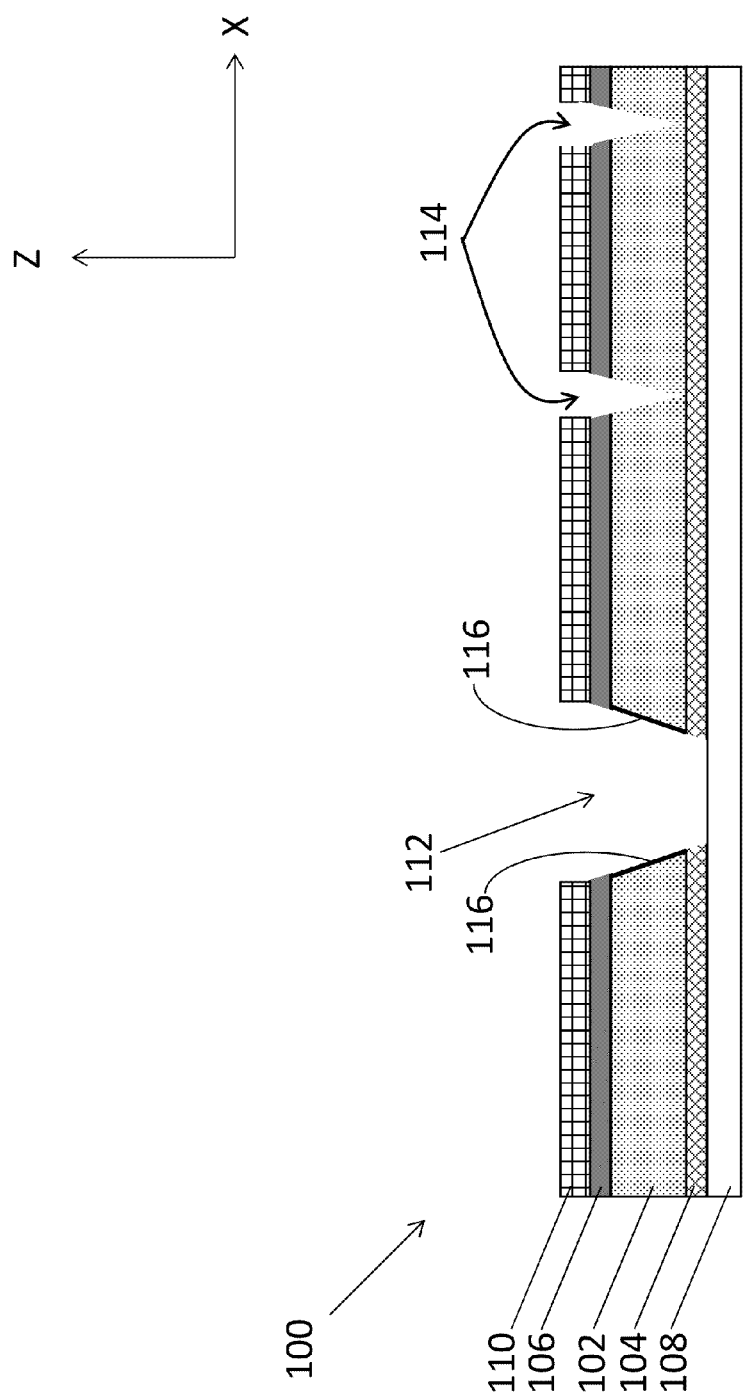
FIG. 3B is a cross-sectional view of the substrate illustrated in FIG. 3A taken along line A-A showing the guard trench transferred completely through the metal gate layer to expose the base layer while the isolated crack is self-limited at the piezoelectric layer without reaching the metal gate layer.

Turning now to FIGS. 3A-3B, a second etching process is performed to transfer the pattern of the guard trench 112 completely through the metal layer 106, the piezoelectric layer 102, and the metal gate layer 104 to expose the base layer 108, while also transferring the isolated crack 114 through the metal layer 106 and into the piezoelectric layer 102. The second etching process includes, for example, a single RIE process. The RIE process may be performed plasma source that delivers a plasma/process gas such as, for example, a mixture of chlorine (Cl$_2$)-carbon tetrafluoride (CF$_4$)-dioxygen (O$_2$) to the guard trench 112 and isolated crack 114 to extend the respective patterns into the underlying layers. The plasma source may have a power source ranging, for example, from 100 watts (W) to 1000 W and may be delivered at density ranging, for example, from 1 millitesla (mT)-100 mT. Since the guard trench 112 is transferred completely through the metal gate layer 104 and exposes the base layer 108, one or more metal electrically conductive sidewalls, i.e., shorts 116, may be formed on the inner walls of the etched guard trench 112. The re-sputtered material can be used, for example, to eliminate the need to perform additional via fabrication steps such as full via filling. In this manner, the metal gate layer 104 may be electrically connected to the second metal layer 106 using the re-sputtered material, if desired. Thus, sputtered residue that coats on the inner walls of the piezoelectric layer 102 when transferring the guard trench 112 through metal gate layer 104 may be acceptable.

Unlike the guard trench 112, however, the isolated crack 114 self-limits at the piezoelectric layer 102 without reaching the metal gate layer 104. According to an embodiment, the self-limiting of the isolated crack 114 can be controlled based on the initial size (e.g., length) of the isolated crack 114 patterned in the hardmask 110, the thickness of the piezoelectric layer 102, and/or the angle at which the isolated crack is transferred into the piezoelectric layer 102. For example, an isolated crack 114 having an initial length of 100 nm may self-limit at a shallower depth than an isolated crack 114 having an initial length of 200 nm.

Since the isolated crack 114 self-limits at the piezoelectric layer 102 without reaching the metal gate layer 104, sputtered metal is prevented from coating the inner walls of the piezoelectric layer 102. As a result, the inner walls of the piezoelectric layer 102 formed when transferring the isolated crack 114 can be protected and neighboring portions of the second metal layer 106 can be electrically isolated from one another without requiring additional masking layers and/or etching processes.

Figure 4:
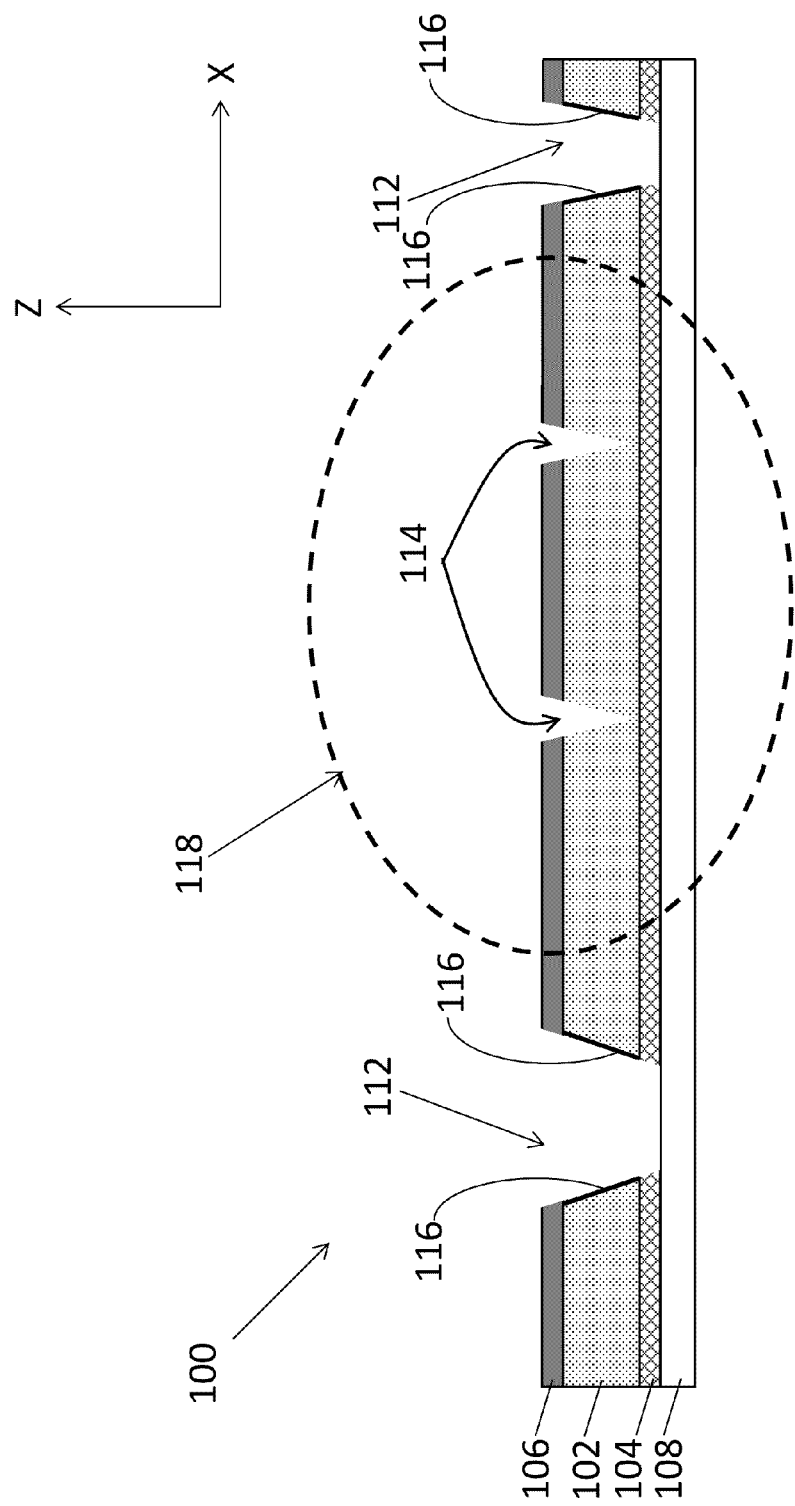

Turning to FIG. 4, remaining portions of the hardmask layer 110 are removed to provide one or more individual PET devices 118. Various etching process can be utilized to remove the hardmask layer 110 including, but not limited to, a wet chemical etching process. Accordingly, the guard trenches 112 isolate an individual PET device 118 from neighboring PET devices. Further, the isolated cracks 114 isolate a first metal layer 104 (i.e., gate) from neighboring first metal layers 104 without requiring the implementation of only non-conductive gate metal materials and/or gate metal materials selected to prevent re-sputtering if the application requires etching through the metal gate layer.

Figure 5:
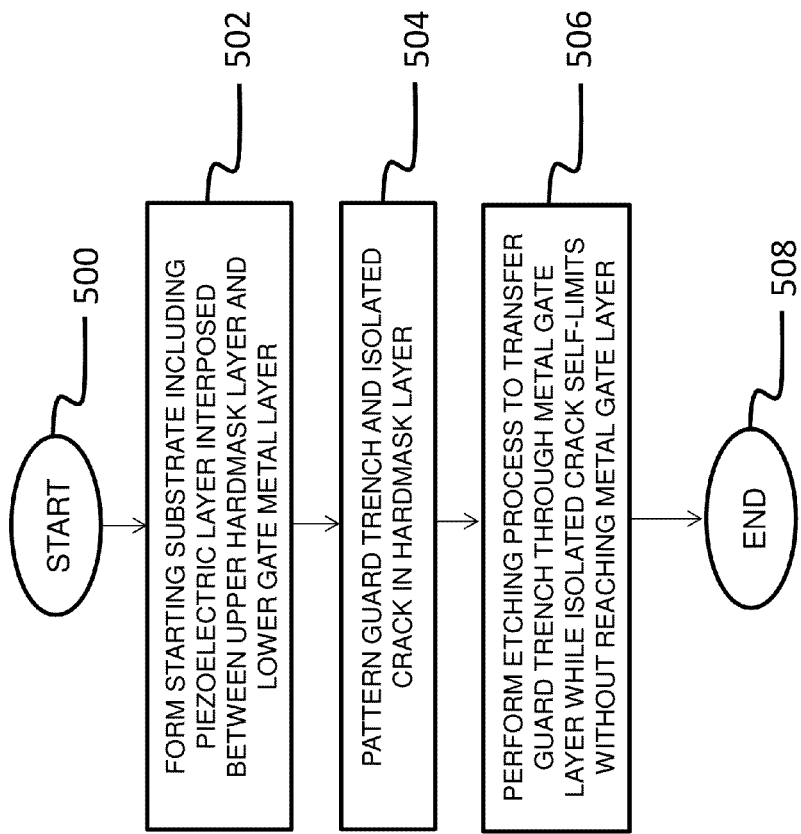

Referring now to FIG. 5, a flow diagram illustrates a method of fabricating a semiconductor device according to a non-limiting embodiment of the invention. The method begins at operation 500, and a starting substrate is formed at operation 502. The starting substrate includes a piezoelectric layer interposed between a metal gate layer and an upper metal layer. The metal gate layer may be formed on a base layer comprising, and a hardmask layer is formed on an upper surface of the upper metal layer. At operation 504, a guard trench and an isolated crack are selectively patterned in the hardmask layer, thereby stopping on the upper metal layer. The guard trench has a size that is greater than the size of the isolation crack. According to an embodiment, the guard trench and the isolation crack are simultaneously patterned in the hardmask layer. At operation 506, an etching process is performed to extend the depth of the guard trench and isolation crack patterns. According to an embodiment, a single RIE process is used to transfer the guard trench through the metal gate layer and expose the base layer, while the isolation crack self-limits at the piezoelectric layer without reaching the metal gate layer, and the method ends at operation 508. In this manner, the sputtered residue (i.e., re-sputtering) is prevented from coating the inner walls of the piezoelectric layer formed in response to transferring the isolated crack.

Conventional process flows for fabricating PETs that sputter through a metal gate layer when forming the first device require additional masking layers to protect a neighboring second PET device where sputtering through the metal gate layer to prevent electrical shorting one the sidewall of the piezoelectric material is undesirable. At least one embodiment of the present invention, however, utilizes a guard trench and one or more self-limiting isolated cracks. The guard trench isolates a PET device from neighboring PET devices formed on the same substrate. The isolated cracks can be sized such that they self-limit before reaching the underlying metal layer. Therefore, the PET device can be formed using the same etching process used to expose the underlying metal layer, without exposing the PE material of the isolated PET device to re-sputtered metal material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a semiconductor device, the method comprising:
    forming a starting substrate including a piezoelectric layer interposed between a first metal layer and a hardmask layer;
    performing a patterning process that forms a first pattern in the hardmask having a first size and a second pattern in the hardmask having a second size less than the first size; and
    performing an etching process that transfers the first pattern through the first metal layer while the second pattern self-limits at the piezoelectric layer without reaching the first metal layer.

2. The method of claim 1, wherein the first pattern and the second pattern are simultaneously formed in the hardmask layer in response to a single patterning process.

3. The method of claim 2, wherein the first pattern surrounds the second pattern.

4. The method of claim 3, wherein the first patterning process includes a reactive ion etch process.

5. The method of claim 4, wherein a depth at which the second trench self-limits is based on the second size of the second pattern formed during the patterning process.

6. The method of claim 5, wherein the etching process is a single reactive ion etching process that simultaneously transfers the first pattern through the first metal layer while the second pattern self-limits at the piezoelectric layer.

7. The method of claim 6, wherein the forming a starting substrate further includes forming the first metal layer on a substrate base and interposing a second metal layer between the piezoelectric layer and the hardmask layer.

8. The method of claim 7, further comprising selectively patterning the hardmask layer using the patterning process such that the first and second patterns stop on an upper surface of the second metal layer.

9. The method of claim 8, further comprising transferring the first pattern and the second pattern through the second metal layer using the etching process, wherein the first trench is transferred through the first metal layer to expose the substrate base.

10. The method of claim 9, wherein the first metal layer is a metal gate layer comprising an electrically conductive metal material.

11. The method of claim 10, wherein the metal gate layer comprises platinum (Pt).

12. The method of claim 11, further comprising forming electrically conductive sidewalls on the inner walls of the first trench to electrically connect the metal gate layer to the second metal layer.

13. A semiconductor device, comprising:
a piezoelectric layer interposed between a first metal layer and a hardmask layer;
a first trench extending through the hardmask layer, the piezoelectric layer and the first metal layer; and
a second trench extending through the hardmask layer and the piezoelectric layer without reaching the first metal layer.

14. The semiconductor device of claim 13, wherein the first trench has a first size and the second trench has a second size that is less than the first size.

15. The semiconductor device of claim 14, wherein the first trench surrounds the second trench.

16. The semiconductor device of claim 15, further comprising a second metal layer interposed between the piezoelectric layer and the hardmask layer.

17. The semiconductor device of claim 16, wherein the first and second metal layers comprises an electrically conductive metal material.

18. The semiconductor device of claim 17, further comprising electrically conductive sidewalls on the inner walls of the first trench, the electrically conductive sidewalls electrically connecting the first metal layer to the second metal layer.

19. The semiconductor device of claim 18, wherein the first metal layer is a gate metal layer comprising nickel.

20. The semiconductor device of claim 19, wherein the piezoelectric layer comprises a material selected from a group including lead magnesium niobate (PMN), lead magnesium niobate-lead titanate (PMN-PT) and lead zirconium titanate (PZT).

* * * * *